United States Patent
Boyd et al.

(10) Patent No.: US 7,040,332 B2
(45) Date of Patent: May 9, 2006

(54) METHOD AND APPARATUS FOR MEGASONIC CLEANING WITH REFLECTED ACOUSTIC WAVES

(75) Inventors: John M. Boyd, Atascadero, CA (US); Fred C. Redeker, Fremont, CA (US); Randolph E. Treur, San Luis Obispo, CA (US); William Thie, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 442 days.

(21) Appl. No.: 10/377,943

(22) Filed: Feb. 28, 2003

(65) Prior Publication Data

US 2004/0168706 A1    Sep. 2, 2004

(51) Int. Cl.
*B08B 3/12*    (2006.01)
(52) U.S. Cl. .................. 134/184; 134/902; 134/1; 134/1.3; 366/127
(58) Field of Classification Search .............. 134/1, 134/184, 902, 1.3; 366/127
See application file for complete search history.

(56) References Cited

U.S. PATENT DOCUMENTS

| 4,118,649 | A | * | 10/1978 | Shwartzman et al. ....... 310/337 |
| 5,071,776 | A | * | 12/1991 | Matsushita et al. ......... 438/460 |
| 5,286,657 | A | * | 2/1994 | Bran ........................ 134/1.3 |
| 5,379,785 | A | * | 1/1995 | Ohmori et al. ............. 134/184 |
| 5,849,091 | A | * | 12/1998 | Skrovan et al. ................ 134/1 |
| 6,220,259 | B1 | * | 4/2001 | Brown et al. ................ 134/184 |
| 6,311,702 | B1 | * | 11/2001 | Fishkin ...................... 134/1.3 |
| 6,460,551 | B1 | * | 10/2002 | Fishkin et al. ............. 134/147 |
| 6,840,250 | B1 | * | 1/2005 | Kashkoush et al. .......... 134/1.3 |
| 2004/0016442 | A1 | * | 1/2004 | Cawlfield ................... 134/1.3 |

FOREIGN PATENT DOCUMENTS

JP    4-87675    * 3/1992

* cited by examiner

*Primary Examiner*—M. Kornakov
(74) *Attorney, Agent, or Firm*—Martine Penilla and Gencarella LLP

(57) ABSTRACT

A system for cleaning a substrate includes a tank defining an inner cavity between a base and sidewalls extending therefrom. A source of acoustic energy affixed to an outer surface of one of the sidewalls. The tank is configured to decouple a direction associated with the acoustic energy from the source of acoustic energy and direct the acoustic energy toward the substrate.

14 Claims, 7 Drawing Sheets

METHOD AND APPARATUS FOR MEGASONIC CLEANING WITH REFLECTED ACOUSTIC WAVES

BACKGROUND OF THE INVENTION

1. Field of the Invention

The present invention relates generally to surface cleaning and, more particularly, to a method and apparatus for megasonic cleaning of a semiconductor substrate following fabrication processes.

2. Description of the Related Art

Megasonic cleaning is widely used in semiconductor manufacturing operations and can be employed in a batch cleaning process or a single wafer cleaning process. For a batch cleaning process, the vibrations of a megasonic transducer creates sonic pressure waves in the liquid of the cleaning tank which contains a batch of semiconductor substrates. A single wafer megasonic cleaning process uses a relatively small transducer above a rotating wafer, wherein the transducer is scanned across the wafer, or in the case of full immersion a single wafer tank system is used. In each case, the main particle removal mechanisms by megasonic cleaning are due to cavitation and acoustic streaming. Cavitation is the rapid forming and collapsing of microscopic bubbles in a liquid medium under the action of sonic agitation. Upon collapse, the bubbles release energy which assists in particle removal through breaking the various adhesion forces which adhere the particle to the substrate. Acoustic streaming is the fluid motion induced by the velocity gradient from propagation of the acoustic wave through the liquid medium under megasonic vibration.

FIG. 1A is a schematic diagram of a batch megasonic cleaning system. Tank 100 is filled with a cleaning solution. Wafer holder 102 includes a batch of wafers to be cleaned. Transducer 104 creates pressure waves through sonic energy with frequencies near 1 Megahertz (MHz). These pressure waves, in concert with the appropriate chemistry to control particle re-adhesion, provide the cleaning action. Because of the long cleaning time required for batch cleaning systems, as well as chemical usage, efforts have been focused on single wafer cleaning systems in order to decrease chemical usage, increase wafer-to-wafer control, and decrease defects in accordance with the International Technology Roadmap for Semiconductors (ITRS) requirements. Batch systems suffer from another disadvantage in that the delivery of megasonic energy to the multiple wafers in the tank is non-uniform and can result in 'hot spots' due to constructive interference, or 'cold spots' due to destructive interference, each being caused by reflection of the megasonic waves from both the multiple wafers and from the megasonic tank. Therefore, a higher megasonic energy must be applied in order to clean all regions of the wafers in wafer holder 102.

FIG. 1B is a schematic diagram of a single wafer cleaning tank. Here, tank 106 is filled with a cleaning solution. Wafer 110, which may be supported by a carrier, is submerged in the cleaning solution of tank 106. Piezo-electric crystals 115a–d are bonded to resonator 112 and provide the acoustic energy to assist in cleaning wafer 110. As it is easier to work with smaller piezo-electric crystals, a number of smaller crystals are typically bonded together with a resonator. However, this configuration causes gaps 114a–c between the respective crystals. Gaps 114a–c result in regions 116a–c not being supplied with a comparable level of acoustic energy as compared with regions 117a–d, due to the collimated nature of the acoustic energy supplied by piezo electric crystals 115a–d. Consequently, certain regions of wafer 110 do not see a uniform acoustic energy, resulting in uneven cleaning.

In view of the foregoing, there is a need for a method and apparatus to provide a single wafer megasonic cleaning configuration that is capable of distributing acoustic energy evenly over the surface of a wafer irrespective of the piezo crystal configuration in order to provide uniform cleaning across a surface of the wafer.

SUMMARY OF THE INVENTION

Broadly speaking, the present invention fills these needs by providing a method and apparatus for supplying acoustic energy which has been decoupled from a source in order to provide a more uniform distribution of acoustic energy across the surface of the substrate. It should be appreciated that the present invention can be implemented in numerous ways, including as a method, a system, or an apparatus. Several inventive embodiments of the present invention are described below.

In one embodiment, a method for cleaning a semiconductor substrate is provided. The method initiates with generating acoustic energy. Then, the acoustic energy is reflected from a reflection surface toward a surface of a semiconductor substrate.

In another embodiment, a method for applying acoustic energy to clean a surface of a substrate is provided. The method initiates with generating acoustic energy oriented in a substantially parallel direction to a surface of a semiconductor substrate from a first transducer. Then, a direction of the acoustic energy from the first transducer is altered to a substantially perpendicular direction relative to the surface of the semiconductor substrate. Next, acoustic energy oriented in the substantially parallel direction to the surface of the semiconductor substrate is generated from a second transducer. In one embodiment, an orientation of the reflective surface is modifiable so that the acoustic energy may be delivered at a number of angles relative to the substrate surface.

In yet another embodiment, an apparatus for cleaning a semiconductor substrate is provided. The apparatus includes a tank defining an inner cavity between a base and sidewalls extending therefrom. A source of acoustic energy affixed to an outer surface of one of the sidewalls is included. The tank is configured to decouple a direction associated with the acoustic energy from the source of acoustic energy.

In still yet another embodiment, a system for cleaning a semiconductor substrate is provided. The system includes a tank having an inner cavity defined by a base and at least one sidewall extending therefrom. The tank is capable of retaining a volume of a liquid within the inner cavity. A substrate support configured to support and rotate a semiconductor substrate about an axis of the semiconductor substrate, as the semiconductor substrate is immersed within the inner cavity of the tank, is included. A megasonic transducer coupled to the base is provided. The megasonic transducer is configured to generate acoustic energy toward a reflective surface associated with the base. The reflective surface is configured to direct the acoustic energy toward a surface of the semiconductor substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1A:
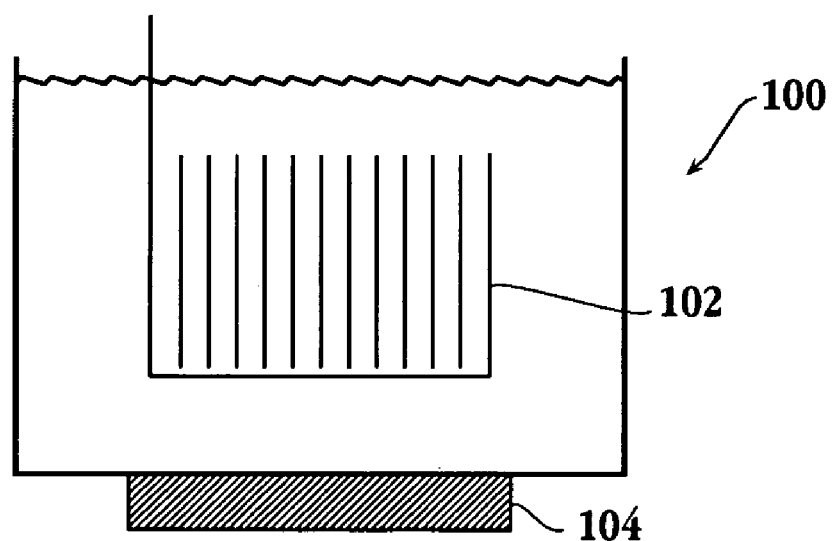
FIG. 1A is a schematic diagram of a batch megasonic cleaning system.
Figure 1B:
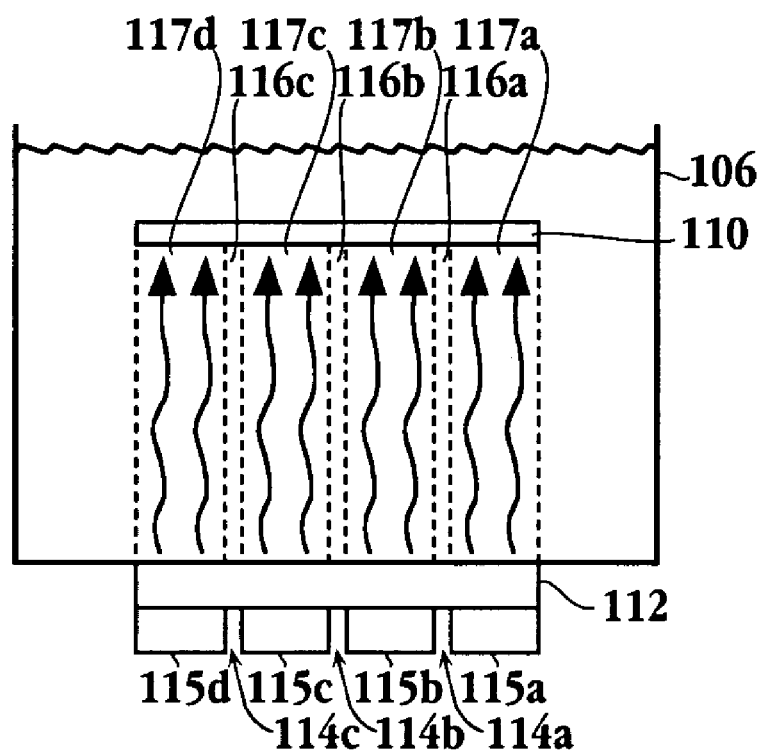
FIG. 1B is a schematic diagram of a single wafer cleaning tank.

An invention is described for a system, apparatus and method that provides a megasonic cleaning scheme where a reflective surface is used to modify the collimated nature of the generated acoustic energy. It will be obvious, however, to one skilled in the art, that the present invention may be practiced without some or all of these specific details. In other instances, well known process operations have not been described in detail in order not to unnecessarily obscure the present invention. FIGS. 1A and 1B are described in the "Background of the Invention" section. The term about as used to herein refers to +/−10% of the referenced value.

The embodiments of the present invention provide a system and method for optimizing the cleaning efficiency of megasonic cleaning of a substrate. As used herein, the terms substrate and wafer are interchangeable. By providing a reflective surface which may scatter, focus or evenly distribute acoustic energy toward a surface to be cleaned, gaps caused by the collimated nature of the acoustic energy generated by a plurality of piezo electric crystals are eliminated. As will be explained in more detail below, the shape of the reflective surface determines the pattern of distribution for the reflected acoustic energy. In one embodiment, multiple megasonic transducers are provided to more efficiently clean high aspect ratio features of patterned substrates. In essence, the reflective surface allows for the decoupling of the acoustic waves from the acoustic energy source.

Figure 2A:
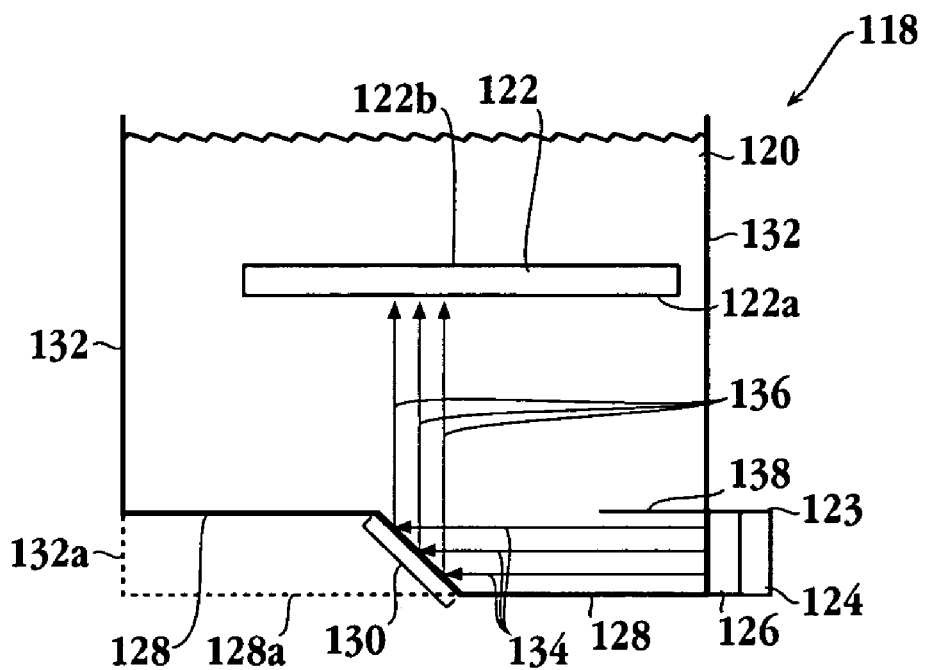
FIG. 2A is a simplified schematic diagram of a cleaning apparatus in which acoustic energy is used to clean a substrate in accordance with one embodiment of the invention.

FIG. 2A is a simplified schematic diagram of a cleaning apparatus in which acoustic energy is used to clean a substrate in accordance with one embodiment of the invention. Cleaning apparatus 118 consists of base 128 and sidewalls 132 extending from the base. Inner cavity 120 is defined between base 128 and sidewalls 132. Cleaning apparatus 118 includes acoustic energy generator 123 which consists of transducer 124 affixed to resonator 126. In one embodiment, acoustic energy generator 123 generates megasonic energy, i.e., transducer 124 is a megasonic transducer. It should be appreciated that while the embodiments described herein refer to megasonic energy, the invention may be applied to any acoustic energy. Acoustic energy generator 123 is positioned at a lower corner of cleaning apparatus 118. One skilled in the art will appreciate that resonator 126 of acoustic energy generator 123 is in contact with a cleaning solution. Thus, the acoustic energy is transferred through the cleaning solution to the substrate in order to assist in the cleaning process.

Continuing with FIG. 2A, acoustic energy generator 123 is configured to generate acoustic waves oriented in a substantially parallel direction relative to bottom surface 122a of substrate 122. The acoustic waves substantially parallel to bottom surface 122a are represented by lines 134. Extension arm 138 extends from sidewall 132 and defines a corridor between base 128 and extension arm 138. Extension arm 138 may be any suitable length. Reflective surface 130 is an angled portion of base 128. Here, acoustic waves generated by acoustic energy generator 123 are reflected off of surface 130 toward a bottom surface 122a of substrate 122. The reflected acoustic energy is represented by lines 136. Reflective surface 130 is angled so that the substantially parallel acoustic energy waves 134 are directed in a substantially perpendicular orientation relative to bottom surface 122a as depicted by lines 136. For example, the angle between surface 130 and base 128 is about 45 degrees.

Still referring to FIG. 2A, it should be appreciated that a direction of the acoustic waves is decoupled from the source of the acoustic energy. Additionally, the configuration of cleaning apparatus 118 allows outside access to the components of acoustic energy generator 123. In one embodiment, cleaning apparatus 118 may be a low profile tank, i.e., substrate 122 is positioned within about one half inch of base 128. It should be appreciated that base 128 may be extended past surface 130 as represented by section 128a. In this embodiment, the region defined between section 128a, section 132a, the elevated portion of base 128, and surface 130, defines a void. In another embodiment, surface 130 is adjustable in order to modulate the angle between surface 130 and base 128. Accordingly, the movement of surface 130 causes the reflected acoustic energy to sweep surface 122a of substrate 130. Consequently, the reflected acoustic energy may be concentrated around an edge region of substrate 122 rather than the center region of the substrate so that the edge region sees an equivalent amount of energy. Of course, substrate 122 is rotating here as illustrated below.

Figure 2B:
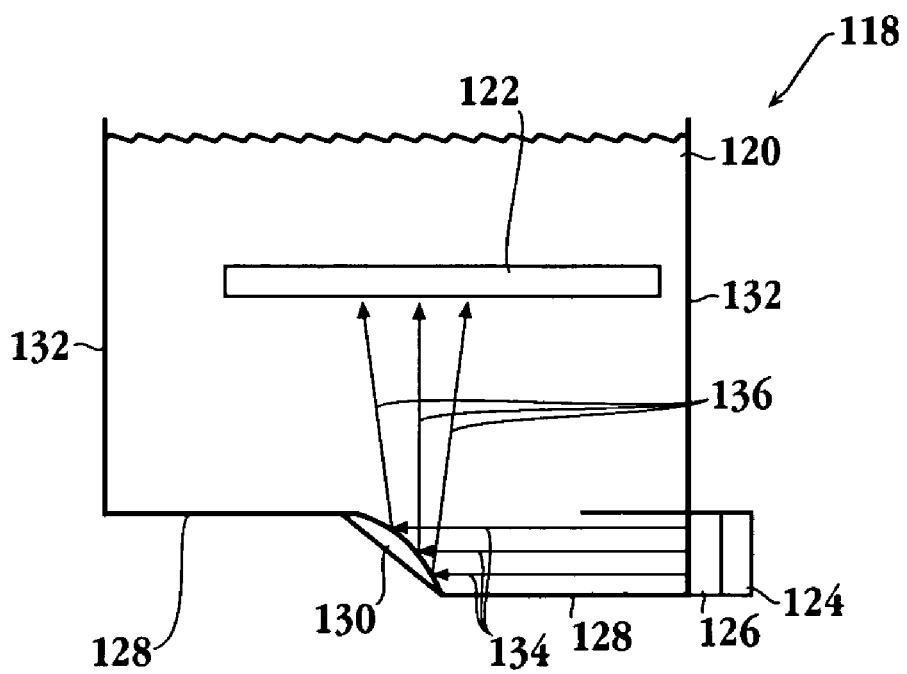
FIG. 2B is an alternate embodiment of the cleaning apparatus of FIG. 2A.

FIG. 2B is an alternate embodiment of the cleaning apparatus of FIG. 2A. Cleaning apparatus 118 includes a tank configured to clean substrate 122, which is immersed in a cleaning solution contained within inner cavity 120. Megasonic transducer 124 is affixed to resonator 126 and generates acoustic energy directed towards reflective surface 130. Here, reflective surface 130 has a convex surface in contact with the cleaning solution of cleaning apparatus 118. Thus, acoustic energy generated by megasonic transducer 124 is reflected in a different pattern as compared to FIG. 2A. Accordingly, the convex shape of reflector 130 causes the generated acoustic energy represented by lines 134 to scatter according to different angles as represented by lines 136. Thus, the reflected acoustic energy, represented by lines 136, impinges on a surface of substrate 122 at a variety of angles. In essence, reflective surface 130 takes a collimated source/acoustic wave and spreads the source/acoustic wave over a defined area. Furthermore, the energy gaps corresponding to the spaces between the piezo electric crystals, are eliminated through the reflection of the acoustic energy.

Figure 2C:
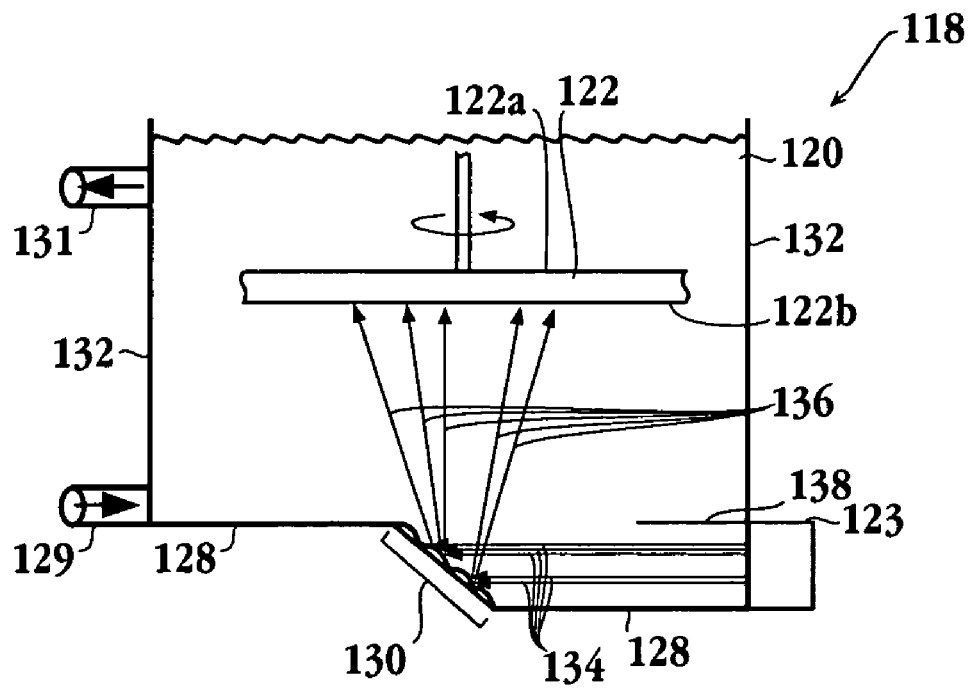
FIG. 2C is yet another embodiment of the cleaning apparatus of FIG. 2A.

FIG. 2C is yet another embodiment of the cleaning apparatus of FIG. 2A. Cleaning apparatus 118 includes a tank containing cleaning solution having a base 128 with sidewalls 132 extending therefrom as in FIG. 2A. However, cleaning apparatus 118 is shown having an alternate reflective surface 130 along with overflow or re-circulation capability. Reflective surface 130 includes a number of convex bumps in order to scatter the acoustic energy generated from acoustic energy generator 123. Thus, the acoustic energy generated in a substantially parallel direction within the corridor defined between base 128 and extension 138 alters a direction of the acoustic energy in order to spread out the reflected acoustic energy across bottom surface 122b of substrate 122. Of course, substrate 122 may be rotating along an axis of the substrate. It will be apparent to one skilled in the art that the rotation of substrate 122 may be provided by any suitable rotation means available. For example, a substrate carrier configured to support substrate 122 may be used to provide the rotational force. Alternatively, rollers supporting edges of substrate 122 may provide the rotational force.

Still referring to FIG. 2C, cleaning apparatus 118 also includes inlet 129 and outlet 131. Inlet 129 provides the capability of flowing fresh cleaning solution into the cleaning apparatus. Outlet 131 is configured to provide an overflow for excess cleaning solution in one embodiment. In an alternative embodiment, outlet 131 may be in communication with inlet 129 through a pump in order to re-circulate the cleaning solution throughout the cleaning apparatus. It will be apparent to one skilled in the art that the cleaning solution is designed for single substrate cleaning applications. In addition, single substrate cleaning solutions are commonly available from companies such a EKC Inc, and Ashland, Inc.

Figure 2D:
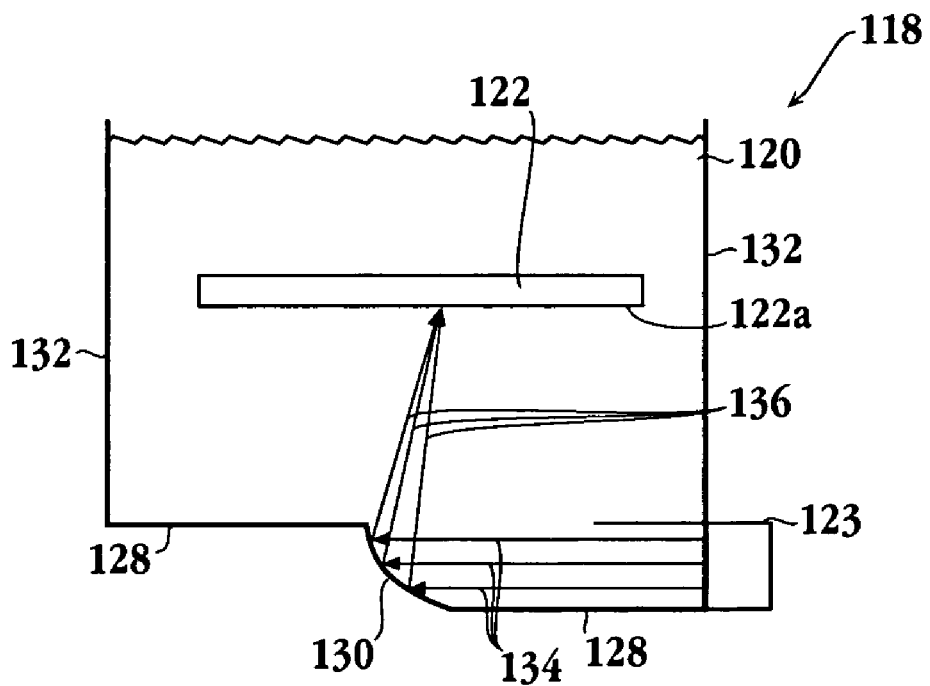
FIG. 2D is still yet another embodiment of the cleaning apparatus of FIG. 2A.

FIG. 2D is still yet another embodiment of the cleaning apparatus of FIG. 2A. Here, reflective surface 130 has a concave shape. One skilled in the art will appreciate that reflected acoustic energy 136 is focused on a particular point of bottom surface 122a of substrate 122. Thus, reflective surface 130 takes the collimated acoustic energy 134 generated by the acoustic energy source 123 and focuses the energy. Reflective surface 130 may have a parabolic shape in order to focus reflected rays 136 to a single point. Alternatively, reflective surface 130 may be cylindrically shaped in order to focus reflective rays along a line. Here again, reflective surface 130 may be moveable in order to sweep the acoustic energy across the surface of a rotating substrate. One skilled in the art will appreciate that numerous other shapes may be defined for reflective surface 130 in order to decouple a direction associated with generated acoustic energy from acoustic energy source 123. That is, reflective surface 130 may be configured to scatter, focus, or evenly distribute the acoustic energy delivered from acoustic energy source 123.

Figure 3:
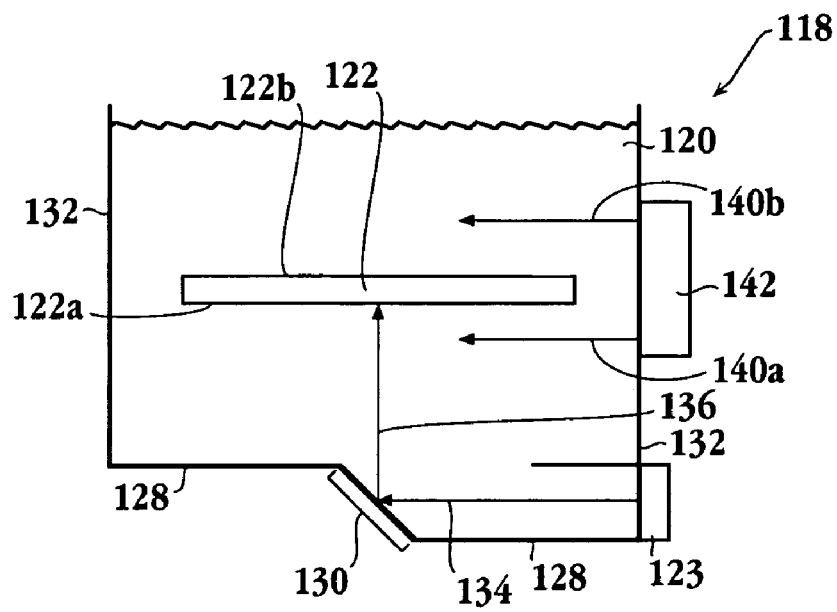
FIG. 3 is a simplified schematic diagram of a cleaning apparatus having two acoustic energy generators in accordance with one embodiment of the invention.

FIG. 3 is a simplified schematic diagram of a cleaning apparatus having two acoustic energy generators in accordance with one embodiment of the invention. Cleaning apparatus 118 includes acoustic energy generators 123 and 142, which may be megasonic transducers. Acoustic energy generators 123 and 142 are configured such that acoustic energy generated from each of the respective acoustic energy generators is oriented in a manner substantially parallel to either top surface 122b or bottom surface 122a of substrate 122. That is, acoustic energy generated from acoustic energy generator 142, represented by lines 140a and 140b, is substantially parallel to top surface 122b and bottom surface 122a of substrate 122. Similarly, acoustic energy generated by acoustic energy generator 123 is also substantially parallel to bottom surface 122a.

Still referring to FIG. 3, the cleaning apparatus may contain megasonic transducers 123 and 142 having faces both of which are substantially perpendicular relative to top and bottom surfaces 122a and 122b of semiconductor substrate 122. Through reflective surface 130, acoustic energy 134 generated by megasonic transducer 123, is re-directed so that the acoustic energy is substantially perpendicular to bottom surface 122a of substrate 122. Thus, the acoustic energy generated by megasonic transducer 123 may be used to provide cavitation in order to dislodge particles within features defined on bottom surface 122a. Megasonic transducer 142 provides acoustic streaming to remove the dislodged particles and refresh cleaning solution within the defined features. Further details of this cleaning action are described with respect to the U.S. Application Ser. No. 10/371,603 filed on Feb. 20, 2003 and entitled "Method and Apparatus for Megasonic Cleaning of Patterned Substrates" which is hereby incorporated by reference in its entirety for all purposes. Of course, substrate 122 may be rotating as illustrated in FIG. 2C. Additionally, cleaning apparatus 118 may include overflow and re-circulation capabilities as illustrated with reference to FIG. 2C.

In another embodiment, reflective surface 130 of FIG. 3 may reflect the acoustic energy at a slight angle relative to a normal of substrate surface 122a. A change in the angle that the acoustic energy impinges on the substrate surface allows for a reduction of oscillation associated with the impedance. In one embodiment, the angle, relative to the normal of the surface of the substrate, is between about 3 degrees and about 6 degrees. The angle introduced reduces impedance variations caused by wafer run-out (wobble) during rotation. In another embodiment, acoustic energy source 123 is auto-tuned as described with reference to the U.S. application Ser. No. 10/360,322 filed on Feb. 6, 2003 entitled "Improved Megasonic Cleaning Efficiency Using Auto-Tuning of an RF Generator at Constant Maximum Efficiency" which is hereby incorporated by reference in its entirety for all purposes.

Figure 4A:
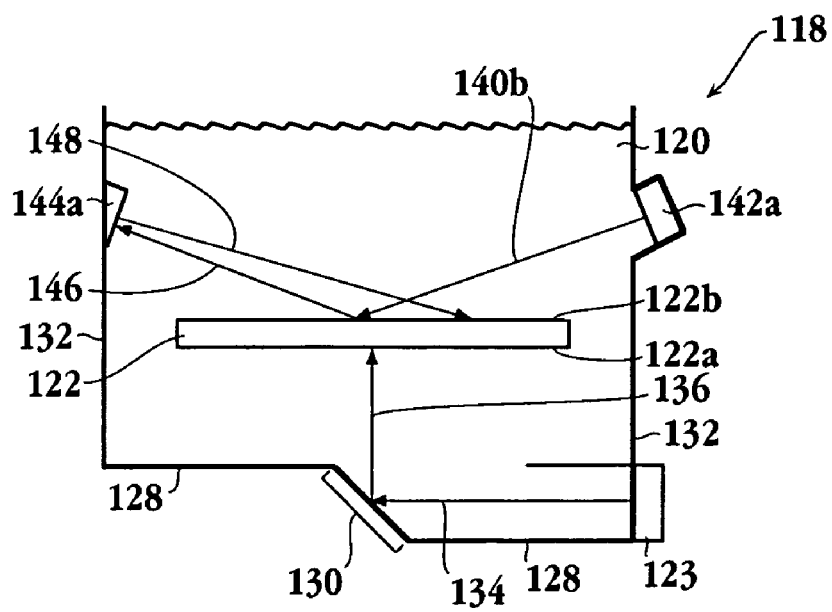
FIG. 4A is a simplified schematic diagram of a cleaning apparatus configured to clean opposing sides of a substrate in accordance with one embodiment of the invention.

FIG. 4A is a simplified schematic diagram of a cleaning apparatus configured to clean opposing sides of a substrate in accordance with one embodiment of the invention. Cleaning apparatus 118 includes acoustic energy generators 123 and 142a configured to provide acoustic energy to opposing surfaces of substrate 122. Acoustic energy generated from acoustic energy generator 123 is reflected from reflective surface 130 in order to clean bottom surface 122a of substrate 122. Acoustic energy generator 142a is configured to provide acoustic energy to top surface 122b of 122 in order to facilitate cleaning of the top surface of the substrate. Here, acoustic energy generator 142a is configured to generate acoustic energy as represented by line 140b which is at a slight angle with respect to top surface 122b of substrate 122. In one embodiment, the angle defined between acoustic energy 140b and top surface 122b is between about zero degrees and five degrees. It should be appreciated that some of acoustic energy 140b will be reflected from top surface 122b as illustrated by line 146. Thus, reflective surface 144a may be positioned to reflect the once reflected acoustic energy 146 back to top surface 122b as illustrated by line 148. Of course, the reflected energy will lose power each time it is reflected, however, the increased acoustic energy will assist in the cleaning of substrate 122.

Figure 4B:
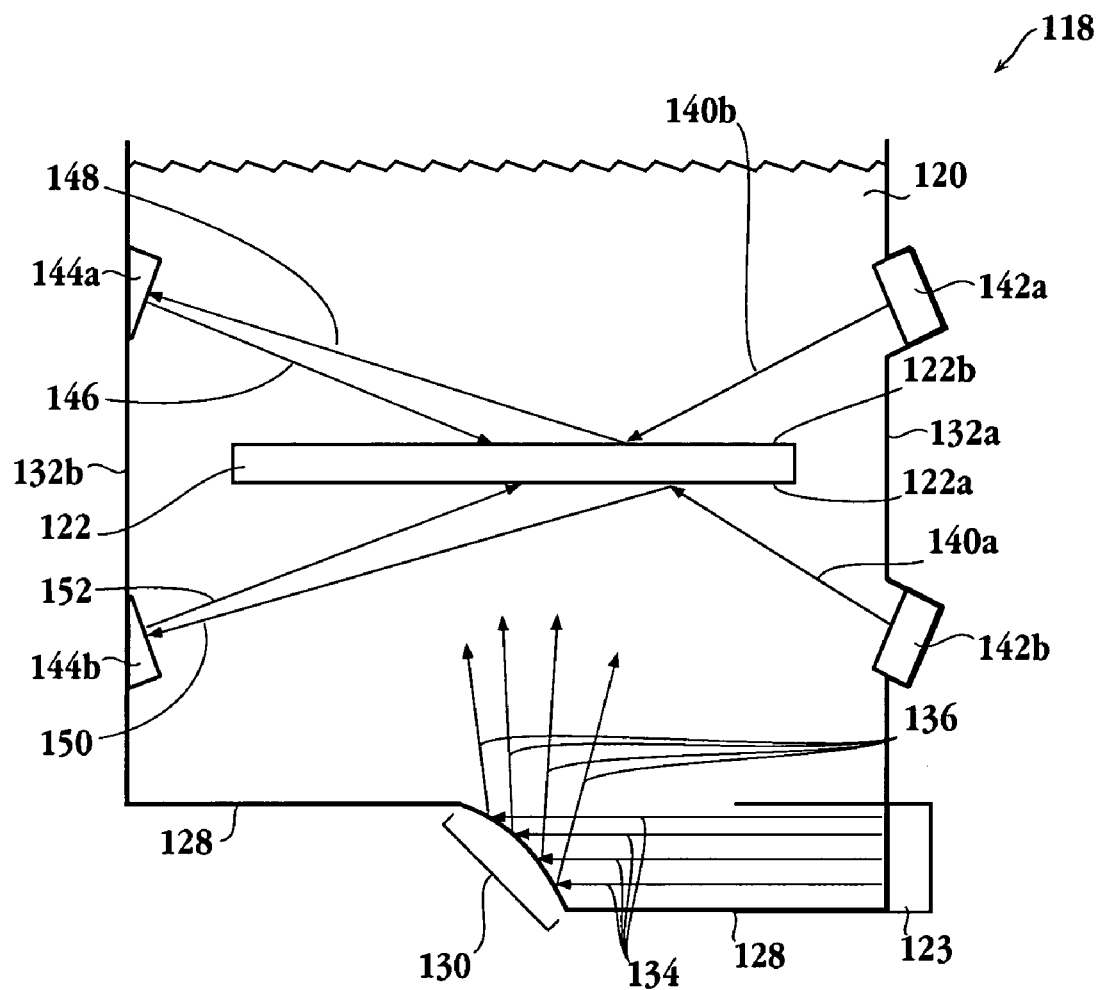
FIG. 4B is a simplified schematic diagram of an alternative embodiment of the cleaning apparatus of FIG. 4A.

FIG. 4B is a simplified schematic diagram of an alternative embodiment of the cleaning apparatus of FIG. 4A. Here, three acoustic energy generators 123, 142a and 142b are provided with cleaning apparatus 118. Acoustic energy generator 123 provides acoustic energy to bottom surface 122a of substrate 122, and similarly acoustic energy generator 142b provides acoustic energy to bottom surface 122a of substrate 122. Acoustic energy generator 142a is configured to provide acoustic energy to the top surface 122b as discussed above with reference to FIG. 4A. Acoustic energy generator 142b generates acoustic energy which is directed at a slight angle to bottom surface 122a of substrate 122. In one embodiment, the angle between acoustic energy represented by line 140a and bottom surface 122a is between about zero degrees and about 5 degrees. Here again, acoustic energy 140a may be reflected from substrate 122a as represented by line 150. Therefore, reflector 144b may be positioned to reflect reflected acoustic energy 150 back to bottom surface 122a of substrate 122 as represented by line 152.

It should be appreciated that while reflective surface 130 is shown having a convex shape, reflective surface 130 may have any suitable shape including the shapes discussed above. Additionally, acoustic energy generators 123, 142a and 142b are megasonic transducers in on embodiment. Substrate 122 may also rotate around its axis during the cleaning process. Cleaning apparatus 118 may be configured to provide re-circulation and overflow capabilities as discussed with reference to FIG. 2C.

Figure 5:
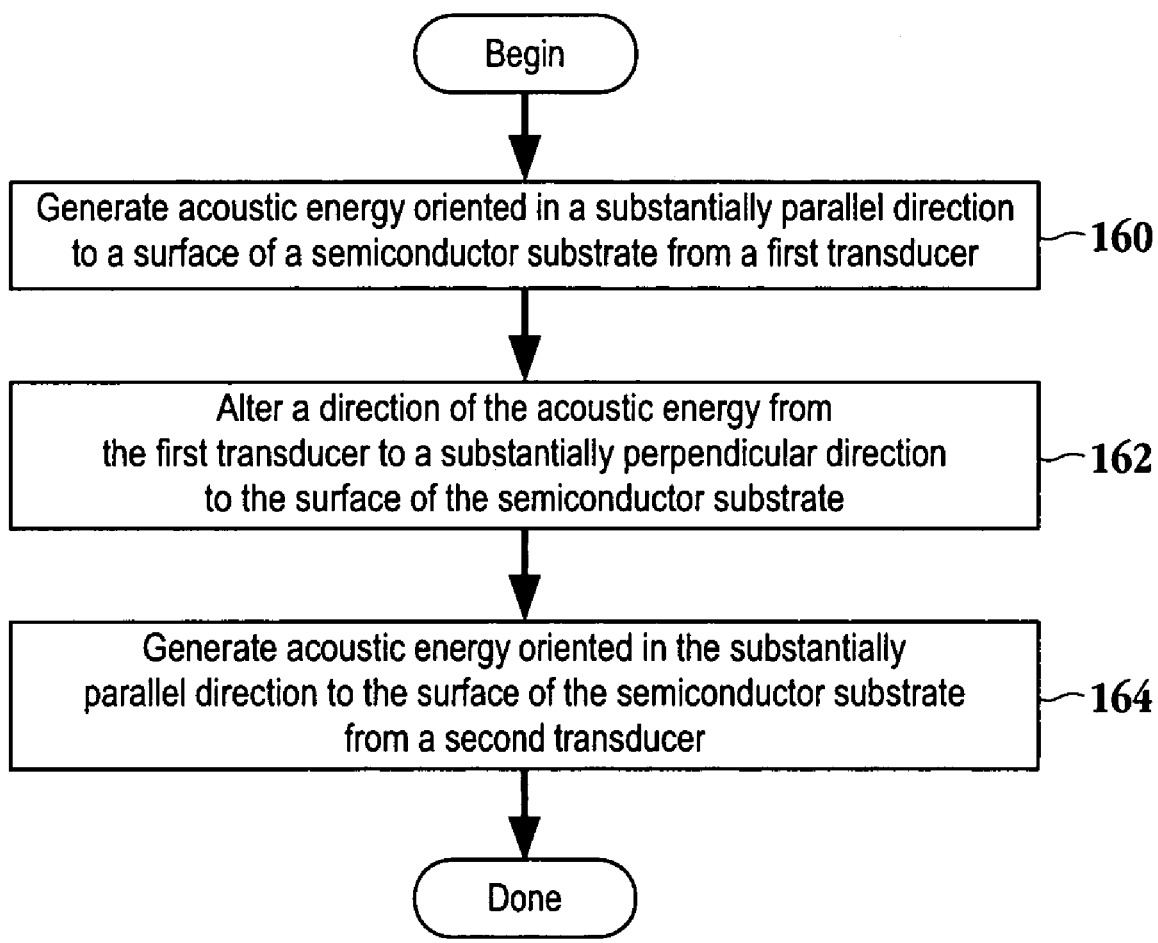
FIG. 5 is a flow chart diagram illustrating the method operations for applying acoustic energy to clean a surface of the substrate in accordance with one embodiment of the invention.

FIG. 5 is a flow chart diagram illustrating the method operations for applying acoustic energy to clean a surface of the substrate in accordance with one embodiment of the invention. The method initiates operation 160 where an acoustic energy oriented in a substantially parallel direction to a surface of a semiconductor substrate is generated from a first transducer. For example, the acoustic energy generated here may be the acoustic energy generated by acoustic energy generator 123 of FIGS. 2A–2D, 3, 4A and 4B. The method then advances to operation 162 where a direction associated with the acoustic energy from the first transducer is altered to a substantially perpendicular direction to the surface of the semiconductor substrate. Here, a reflective surface such as the reflective surface as discussed above with reference to FIGS. 2A–2D, 3, 4A and 4B, may alter the direction of the acoustic energy. It should be appreciated that the acoustic energy may be focused, scattered or evenly distributed. Thus, the reflective surface essentially decouples a direction of the acoustic energy from the source of the acoustic energy. Furthermore, the reflective surface may modulate or move in order to sweep the acoustic energy across a surface of a substrate to be cleaned.

The method of FIG. 5 then advances to operation 164 where acoustic energy oriented in a substantially parallel direction to the surface of the semiconductor substrate is generated from a second transducer. Here, the second transducer may provide acoustic streaming in order to more efficiently clean the surface of the substrate. It should be appreciated that the acoustic energy generated from the second transducer may be oriented at a slight angle to a surface of semiconductor substrate as described above with reference to FIGS. 4A and 4B. In addition, a third acoustic energy generator may be provided in order to direct acoustic energy toward an opposing surface from the surface which acoustic energy from the second transducer is directed at.

In summary, the above described invention describes a method and a system for optimizing the cleaning efficiency for semiconductor substrates. The cleaning apparatus eliminates dead zones by decoupling the acoustic waves from the acoustic generator. The decoupling effect is provided by a reflective surface positioned to reflect acoustic energy toward a surface of the substrate to be cleaned. Multiple transducers may be included to further increase the cleaning efficiency. In one embodiment, two transducers oriented in a substantially perpendicular manner relative to a surface of the substrate, are provided. Both transducers provides acoustic energy directed in a substantially parallel direction to the surface of the substrate, however, one acoustic energy stream is re-directed by a reflective surface so that the acoustic energy is substantially perpendicular to the substrate surface. The reflective surface may be composed of any material compatible with the cleaning solutions and reflective to the acoustic energy. For example, the reflective material may be stainless steel, quartz, Teflon, polypropylene, Silicon Carbide, or other materials which are compatible with the cleaning chemistry used in the system. In another embodiment, the reflective surface is configured to move about an axis associated with the reflective surface. Consequently, the acoustic energy may be swept across the surface of the substrate in order to distribute the acoustic energy more evenly over the substrate surface as the substrate is rotating.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An apparatus for cleaning a single semiconductor substrate, comprising:
a tank defining an inner cavity and having lower corners between a base and sidewalls substantially perpendicular to the base; a substrate support configured to support the single semiconductor substrate within the cavity in substantially horizontal orientation; and a source of acoustic energy positioned at lower corner of the tank and affixed to an outer surface of one of the sidewalls, wherein the base includes a surface, which is configured to decouple the acoustic energy from the source of acoustic energy and direct the acoustic energy toward the substrate.

2. The apparatus of claim 1, wherein the source of acoustic energy is a megasonic transducer.

3. The apparatus of claim 1, wherein the base of the tank includes a surface configured to reflect the acoustic energy.

4. The apparatus of claim 1, further comprising:
a second source of acoustic energy affixed to one of the sidewalls, the second source of acoustic energy configured to direct acoustic energy substantially parallel to a surface of a substrate immersed in a cleaning solution contained within the inner cavity of the tank.

5. The apparatus of claim 4, wherein the source of acoustic energy affixed to one of the sidewalls and the second source of acoustic energy are configured to generate the respective acoustic energy in one of an in phase manner and an out of phase manner.

6. A system for cleaning a semiconductor substrate, comprising:
- a tank having an inner cavity and a lower corner defined by a base and at least one sidewall substantially perpendicular extending therefrom, the tank capable of retaining a volume of a liquid within the inner cavity;
- a substrate support configured to support and rotate a semiconductor substrate, whose surface is substantially perpendicular to at least one sidewall, the surface is rotatable about an axis of the semiconductor substrate as the semiconductor substrate is immersed within the inner cavity of the tank; and
- a first megasonic transducer positioned at the lower corner of the tank and coupled to the an outer surface of the at least one sidewall, the first megasonic transducer configured to generate acoustic energy toward a reflective surface of the base, the reflective surface configured to direct the acoustic energy toward a surface of the semiconductor substrate.

7. The system of claim 6, further comprising:
- a second megasonic transducer coupled to the at least one sidewall, the second megasonic transducer configured to direct acoustic energy substantially parallel to a surface of the semiconductor substrate.

8. The system of claim 7, wherein the megasonic transducer coupled to the at least one sidewall and the second megasonic transducer are configured to generate respective acoustic energy in one of an in phase manner and an out of phase manner.

9. The system of claim 6, wherein the reflective surface is has a shape selected from the group consisting of substantially flat, concave and convex.

10. The system of claim 7, further comprising:
- a third megasonic transducer coupled to the at least one sidewall, the third megasonic transducer configured to direct acoustic energy substantially parallel to an opposing surface of the semiconductor substrate relative to the surface of the semiconductor substrate.

11. The system of claim 7, further comprising:
- a second reflective surface configured to reflect acoustic energy from the second megasonic transducer toward the surface of the semiconductor substrate.

12. A system for cleaning a semiconductor substrate, comprising:
- a tank having an inner cavity and a lower corner defined by a base and at least one sidewall substantially perpendicular extending therefrom extending therefrom, the tank capable of retaining a volume of a liquid within the inner cavity;
- a substrate support configured to support and rotate a semiconductor substrate, whose surface is substantially perpendicular to at least one sidewall, the surface is rotatable, about an axis of the semiconductor substrate as the semiconductor substrate is immersed within the inner cavity of the tank; and
- a first megasonic transducer positioned at the lower corner of the tank and coupled to the an outer surface of the least one sidewall, the first megasonic transducer configured to generate acoustic energy toward a reflective surface of the base, the reflective surface configured to one of scatter or evenly distribute the acoustic energy toward a surface of the semiconductor substrate.

13. The system of claim 12, further comprising:
- a second megasonic transducer coupled to the at least one sidewall, the second megasonic transducer configured to direct acoustic energy substantially parallel to a surface of the semiconductor substrate.

14. The system of claim 13, wherein the first megasonic transducer and the second megasonic transducer are configured to generate respective acoustic energy in one of an in phase manner or an out of phase manner.

* * * * *